United States Patent
Daufeld et al.

(10) Patent No.: US 11,552,625 B2
(45) Date of Patent: Jan. 10, 2023

(54) TRANSMITTING DEVICE FOR TRANSMITTING DIGITAL SIGNALS BETWEEN GALVANICALLY ISOLATED CIRCUIT PARTS, AND FIELD DEVICE HAVING A TRANSMITTING DEVICE OF THIS TYPE

(71) Applicant: Endress+Hauser SE+Co. KG, Maulburg (DE)

(72) Inventors: Ghislain Daufeld, Village Neuf (FR); Arnd Kempa, Steinen (DE); Roland Grozinger, Neuenburg (DE); Stefan Scherr, Kandern (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 0 days.

(21) Appl. No.: 17/415,158

(22) PCT Filed: Nov. 21, 2019

(86) PCT No.: PCT/EP2019/082022
§ 371 (c)(1),
(2) Date: Jun. 17, 2021

(87) PCT Pub. No.: WO2020/126276
PCT Pub. Date: Jun. 25, 2020

(65) Prior Publication Data
US 2022/0060182 A1    Feb. 24, 2022

(30) Foreign Application Priority Data
Dec. 19, 2018 (DE) .................... 10 2018 132 936.9

(51) Int. Cl.
*H04B 1/04*        (2006.01)
*H03K 5/1252*    (2006.01)
*H03K 19/20*     (2006.01)

(52) U.S. Cl.
CPC .......... *H03K 5/1252* (2013.01); *H03K 19/20* (2013.01); *H04B 1/04* (2013.01)

(58) Field of Classification Search
CPC ........ H02M 1/08; H02M 3/335; H03K 5/125; H03K 5/135; H03K 5/1252; H03K 17/61;
(Continued)

(56) References Cited

U.S. PATENT DOCUMENTS

2002/0122496 A1*  9/2002  Klein-Reesink .... H04L 25/0268
375/257
2009/0243028 A1   10/2009  Dong et al.
2017/0117815 A1*  4/2017  Sato .................. H02M 3/33546

FOREIGN PATENT DOCUMENTS

DE    102007050821 A1    4/2009
WO       0101645 A1    1/2001

OTHER PUBLICATIONS

Texas Instruments, ISO154x Low-Power Bidirectional I2C Isolators, ISO1540, ISO1541, Jul. 2012 (revised Dec. 2016), 36 pp.

* cited by examiner

*Primary Examiner* — Shawkat M Ali
(74) *Attorney, Agent, or Firm* — Mark A. Logan; Endress+Hauser (USA) Holding, Inc.

(57) ABSTRACT

Disclosed is a transmitting device comprising two galvanically isolated sub-circuits. The first sub-circuit comprises: a carrier signal source for outputting a carrier signal; a digital signal source for outputting binary signal levels; and a logic component for performing an AND operation on two input signals. The second sub-circuit comprises: a signal input; a signal output; and a first RC element, the signal input, the signal output and the RC element being connected in parallel to one another with respect to a second reference potential. A first isolating capacitor is connected between the first logic output and the signal input for galvanic isolation. A second (Continued)

isolating capacitor is connected between the first reference potential and the second reference potential for galvanic isolation.

14 Claims, 2 Drawing Sheets

(58) Field of Classification Search
CPC ...... H03K 175/689; H03K 19/20; H04B 1/04; H04B 1/38; H04B 31/00; H04B 10/80; H04L 5/14; H04L 25/00; H04L 25/02
USPC .......................... 375/219, 222, 244, 257, 295
See application file for complete search history.

TRANSMITTING DEVICE FOR TRANSMITTING DIGITAL SIGNALS BETWEEN GALVANICALLY ISOLATED CIRCUIT PARTS, AND FIELD DEVICE HAVING A TRANSMITTING DEVICE OF THIS TYPE

CROSS-REFERENCE TO RELATED APPLICATIONS

The present application is related to and claims the priority benefit of German Patent Application No. 10 2018 132 936.9, filed on Dec. 19, 2018 and International Patent Application No. PCT/EP2019/082022, filed on Nov. 21, 2019, the entire contents of which are incorporated herein by reference.

TECHNICAL FIELD

The present invention relates to a transmitting device for transmitting digital signals between galvanically isolated circuit parts and to a field device having a transmitting device of this type:

BACKGROUND

The object of the present invention is to provide a transmitting device and a field device having such a transmitting device which enables a simple transmission of digital signals between different circuit parts of a modular electronics unit, especially a field device electronics unit.

SUMMARY

The transmitting device according to the invention comprises: a first sub-circuit and a second sub-circuit which is galvanically isolated from the first sub-circuit, is also configured to be supplied with power from the first sub-circuit, and/or to communicate with the first sub-circuit via digital signals, which are transmitted as a temporal sequence of binary signal levels; wherein the first sub-circuit comprises: a carrier signal source which is configured to output a carrier signal with a constant carrier frequency and with a constant amplitude to a carrier signal output; a digital signal source that is configured to output binary signal levels with a useful signal frequency at a signal level output which has no more than 10%, for example, no more than 1% of the carrier frequency; a first logical component which is configured to perform an AND operation of two input signals having a first logic input, a second logic input and a first logic output which is configured to output a first logic output signal with respect to a first reference potential, wherein the first logic input is connected to the signal level output, wherein the second logic input is connected to the carrier signal source output; wherein the second sub-circuit comprises: a signal input; a signal output; a first RC element; wherein the signal input, the signal output and the RC element are connected in parallel to one another with respect to a second reference potential; wherein a first isolating capacitor is connected between the first logic output and the signal input for galvanic isolation; and wherein a second isolating capacitor is connected between the first reference potential and the second reference potential for galvanic isolation.

In a development of the invention, the first and second isolating capacitors each comprise a series circuit of a plurality of capacitors, in particular three capacitors.

In a development of the invention, the signal input comprises at least two Schottky diodes which are arranged in series with each other parallel to the first RC element, wherein the first isolating capacitor is connected to the signal input between the at least two Schottky diodes.

In a development of the invention, the carrier signal source comprises an oscillator.

In a development of the invention, a first Schmitt trigger is arranged between the first logic output and the first isolating capacitor.

In a development of the invention, a second Schmitt trigger is arranged between the first RC element and the signal output.

In a development of the invention, the carrier signal frequency is not less than 1 MHz, in particular not less than 2 MHz, wherein the useful signal frequency is not less than 10 kHz, for example not less than 20 kHz, and in particular not less than 40 kHz.

In a development of the invention, the transmitting device comprises a CPLD (complex programmable logical device) or a microcontroller, wherein the carrier signal source and the first logic component are integrated into the CPLD or the microcontroller.

In a development of the invention, the signal output is connected to a bus, especially an I²C bus.

In a development of the invention, the transmitting device further comprises a reverse transmission path for transmitting digital signals from the second sub-circuit to the first sub-circuit, wherein the transmission path comprises a second logic component which is configured to perform an AND operation of two input signals, with a third logic input, a fourth logic input and a second logic output, wherein the third logic input is connected to the bus, wherein the fourth logic input is applied with a potential that is tapped between the first isolating capacitor and the first RC element, wherein the second logic output is connected to a signal input of the first circuit part via a third isolating capacitor.

In a development of the invention, the transmitting device further comprises a second CPLD or microcontroller, wherein the second logic component is integrated into the second CPLD or microcontroller.

In a development of the invention, the signal source comprises a microprocessor.

The field device according to the invention in industrial process measurement technology comprises a transmitting device according to the invention, wherein the first sub-circuit comprises a main electronics unit of the field device, wherein the second sub-circuit comprises a sensor electronics unit of the field device, wherein the sensor electronics unit comprises an I²C converter for converting a primary signal dependent on a measured value into a digital signal which is to be output via the I²C bus and the reverse transmission path to the first sub-circuit.

In a development of the invention, the I²C converter comprises a capacitive converter.

BRIEF DESCRIPTION OF THE DRAWINGS

The invention is explained below on the basis of an exemplary embodiment shown in the drawings. The following is shown.

DETAILED DESCRIPTION

Figure 1:
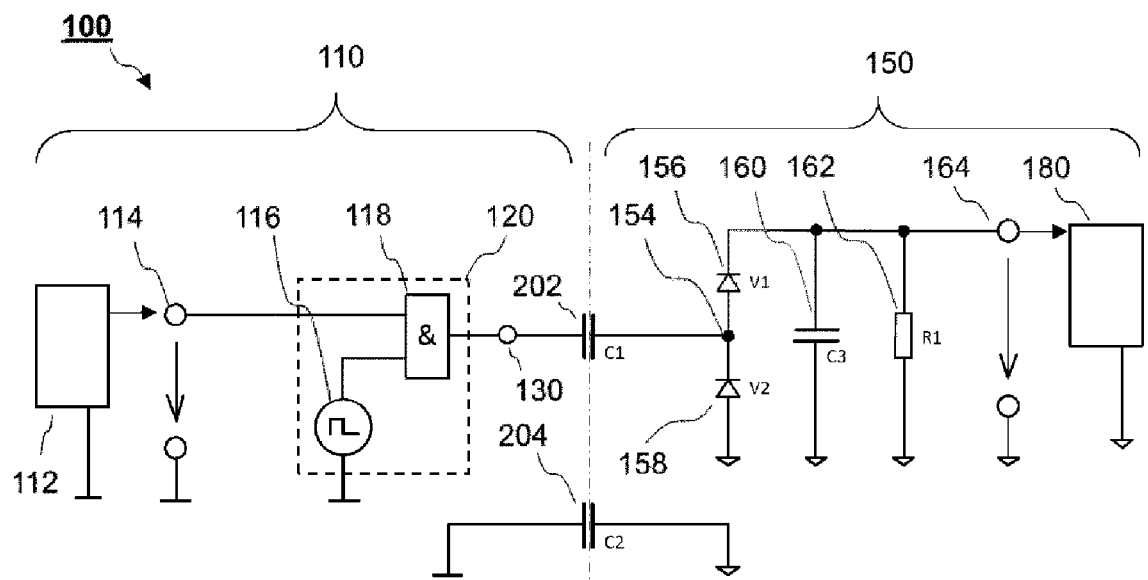
FIG. 1 shows a schematic representation of a first exemplary embodiment of a transmitting device according to the present disclosure.

The exemplary embodiment of a transmitting device 100 shown in FIG. 1 comprises a first circuit part 110 and a second circuit part 150, wherein the two circuit parts are galvanically isolated from each other.

The first sub-circuit 110 comprises a digital signal source 112, in this case a microprocessor, which is configured to output binary signal levels with a useful signal frequency at a signal level output. Wherein the useful signal frequency can be 40 kHz, for example. Furthermore, the first circuit part 100 comprises a carrier signal source, in this case a clock signal generator 116 having a frequency of 4 MHz, for example. In this case, the clock signal frequency is one hundred times the useful signal frequency, which is more than sufficient. At all events it is advantageous if the clock frequency is at least ten times the useful signal frequency. The first sub-circuit further comprises a first logic component 118 for implementing an AND operation between two signals, which in its simplest form can be a discrete AND gate. However, in the present case, it is preferable to integrate the first logic component 118 together with the clock signal generator 116 into a CPLD or microcontroller. The signal level output of the digital signal source 112 is connected to a first logic input 114 of the first logic component 118, wherein the second logic input is connected to the output of the clock generator 116.

Figure 2:
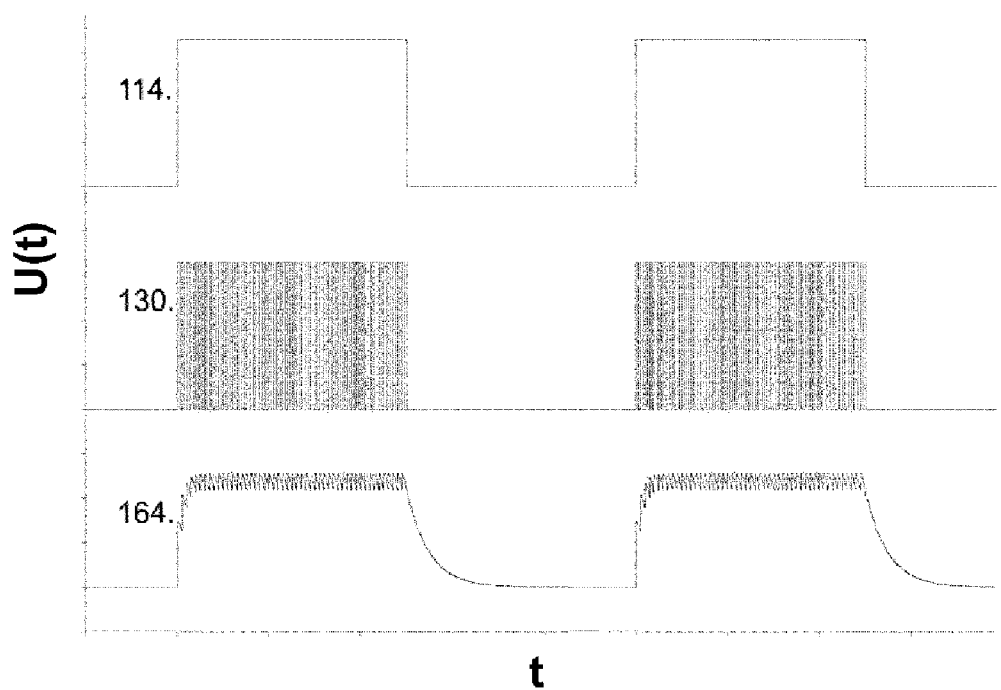
FIG. 2 shows signal plots during operation of the transmitting device of FIG. 1.

The curve 114. in FIG. 2 shows by way of example a sequence of binary signal levels, namely 1 and 0 at the first logic input 114, while the curve 130. represents the resulting signal at the first logic output 130 of the first logic component 118. If the level at the first logic input 114 assumes the higher value 1, the carrier signal will be output at the first logic output 130; otherwise not. This 4-MHz oscillating signal can be transmitted via a first isolating capacitor 202 to the galvanically isolated second sub-circuit 150.

In the drawing, the first isolating capacitor as 202 is represented as a single capacitor C1. In fact, the first isolating capacitor 202 is implemented as a series circuit of three capacitors for reasons relating to explosion protection. The same applies to a second isolating capacitor 204 which is arranged between the reference potentials of the first sub-circuit 110 and the second sub-circuit 150.

The second sub-circuit 150 comprises: a signal input 154 connected to the first isolating capacitor 202, a signal output 164, and a first RC element having a first smoothing capacitor 160 and a first discharge resistance element 162. The signal input 154, the signal output 164, the first smoothing capacitor 160 and the discharge resistance element 162 are connected in parallel to one another with respect to the second reference potential. A first Schottky diode 156 is arranged between the signal input 154 and the RC element or the signal output, wherein a second Schottky diode 158 is connected between the second reference potential and the signal input 154. The first smoothing capacitor may, for example, have a capacitance of a few 10 pF, in particular 40 . . . 60 pF. The discharge resistance element may have, for example, a resistance value of a few kΩ, in particular 20 . . . 30 kΩ. The resulting smoothed signal at the signal output 164 is represented as curve 164. in FIG. 2. It can be seen that the signal fed in at the first logic input 114 of the digital signal source 112 is transmitted reliably and without delay with a signal swing which is suitable for further processing.

Figure 3:
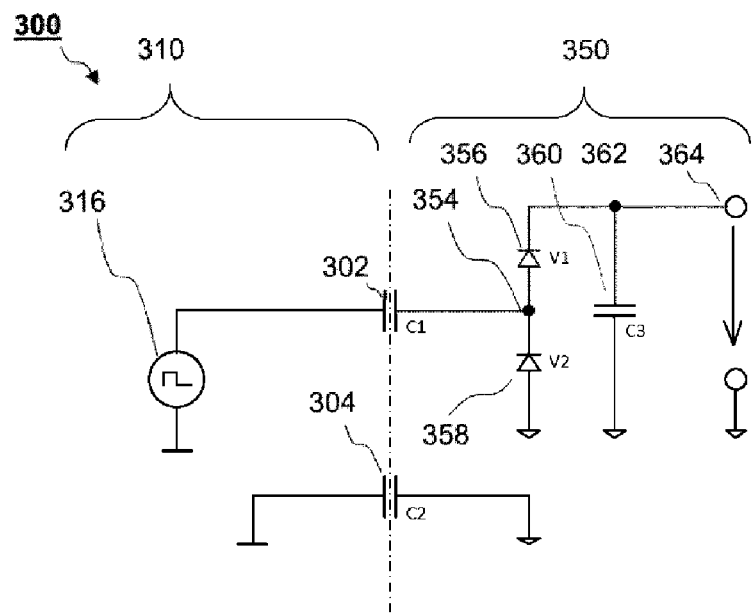
FIG. 3 shows an exemplary embodiment of a circuit for energy transmission for a transmitting device according to the present disclosure.

FIG. 3 shows an exemplary embodiment of a transmitting device 300 for supplying power to a second circuit part 350 through a first circuit part 310 wherein the two circuit parts are galvanically isolated from each other. The transmission principle is similar to that of FIG. 1, wherein neither a digital signal source nor a logic component is required in this case for implementing an AND operation. The discharge resistance element is also eliminated. The first sub-circuit 310 comprises a carrier signal source, in this case a switching controller 316, for example a TPS 62240 having a frequency of, for example, 1 to 2 MHz. This high-frequency signal can be transmitted via a first isolating capacitor 302 to the galvanically isolated second sub-circuit 350. In the drawing, the first isolating capacitor as 302 is represented as a single capacitor C1. In fact, the first isolating capacitor 302 is implemented as a series circuit of three capacitors for reasons relating to explosion protection. The same applies to a second isolating capacitor 304 which is arranged between the reference potentials of the first sub-circuit 310 and the second sub-circuit 350. The second sub-circuit 350 comprises: a power signal input 354 connected to the first isolating capacitor 302, a power signal output 364, and a smoothing capacitor 360. The power signal input 354, the power signal output 364 and the smoothing capacitor 360 are connected in parallel to each other with respect to the second reference potential. A first Schottky diode 356 is arranged between the power signal input 354 and the smoothing capacitor 360 or the power signal output 364, wherein a second Schottky diode 358 is connected between the second reference potential and the power signal input 354. The first smoothing capacitor may, for example, have a capacitance of a few pF, in particular 10 . . . 100 µF. The transmitting device shown in FIG. 3 can be combined well with the first exemplary embodiment in order to realize a power supply of the second sub-circuit.

The invention can be implemented especially in field devices of industrial process measurement technology, wherein such field devices are configured to detect measured values such as fill level, flow pressure temperature, pH value, density viscosity, electrical conductivity or substance concentrations and to output a corresponding measurement signal.

Figure 4:
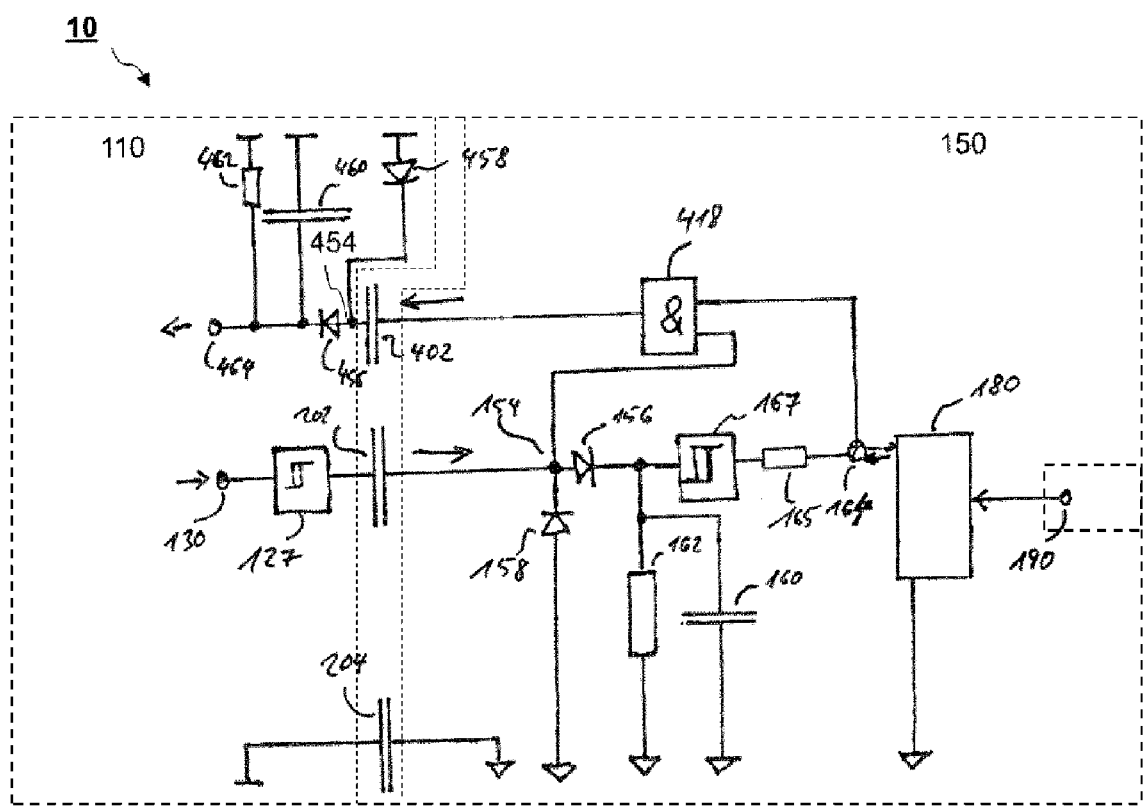
FIG. 4 shows an exemplary embodiment of a field device according to the present disclosure.

FIG. 4 shows, starting on the basis of the first exemplary embodiment of a transmitting device, an exemplary embodiment of an operating circuit of a field device 10. The field device 10 comprises a first sub-circuit 110 and a second sub-circuit 150 which is galvanically isolated from the first sub-circuit 110 by isolating capacitors 202, 204, 402. With regard to the components provided with the same reference characters as in FIG. 1, the statements relating to FIG. 1 apply correspondingly. The first sub-circuit 110 further comprises functions of a main electronics unit, which in a known manner ensures communication with a control system and the power supply of the field device 10. Although the circuit components upstream of the first logic output 130 are not shown, they are of course present. In supplementation of the first exemplary embodiment, a first Schmitt trigger 127 for conditioning the signal to be transmitted is arranged between the first logic output and the first isolating capacitor 202. A second Schmitt trigger 167 is arranged between the RC element and the signal output 167. This eliminates the time-extended edges of the signal 164. shown in FIG. 2. A so-called pull-up resistance element 165 is arranged immediately before the signal output 164 and has a resistance value of, for example, 10 kΩ. The signal output 164 is connected via an I²C bus to the communication interface of a measuring transducer 180 which generates a digital signal dependent on an analog primary signal of an analog measuring circuit 190. The circuit further comprises a return signal path for transmitting the digital signal to the first circuit part or the main electronics unit. The digital signal is output to the signal output 164. From there, it passes through a branch to a third logic input of a second logic component 418 which in turn implements an AND operation of the input signals. If the signal is to be transmitted from the measuring transducer, the output of the digital signal source 112 will be set to "high." The carrier signal is thus continuously transmitted and arrives at the fourth logic input of the second logic component 418.

To output a "high", the measuring transducer 180 connects a high input impedance which is substantially greater than the resistance of the pull-up resistor element 165. The continuous "high" level set by the Schnitt trigger 167 is thus routed to the third logic input of the second logic component.

To output a "low", the measuring transducer 180 connects a low input impedance which is substantially less than the resistance of the pull-up resistor element 165. The continuous "high" level set by the Schnitt trigger 167 thus collapses behind the pull-up resistor element 165, which effects the desired "low" at the third logic input.

A second logic output of the second logic component 418 outputs an output signal via a third isolating capacitor 402 to a return signal input 454 of the first sub-circuit 110, which in turn is flanked by two Schottky diodes 456, 458.

From the return signal input 454, the signal arrives at the return signal output 464, wherein the return signal input 454 and the return signal output, with respect to the first reference potential, are connected in parallel at a second smoothing capacitor 460 and a second discharge resistance element 462. The capacitance of the second smoothing capacitor 460 is about the same as the capacitance of the first smoothing capacitor 160. The resistance of the second discharge resistance element 462 is about the same as the resistance of the first discharge resistance element 162.

A capacitive measuring transducer, for example, a measuring transducer available under the designation FDC2212 from Texas Instruments, is used in particular as the measuring transducer.

The invention claimed is:
1. A transmitting device, comprising:
a first sub-circuit; and
a second sub-circuit galvanically isolated from the first sub-circuit, the second sub-circuit configured to be supplied with power from the first sub-circuit and to communicate digitally with the first sub-circuit,
wherein the first sub-circuit includes:
   a carrier signal source configured to output at a carrier signal source output a carrier signal having a constant carrier frequency and a constant amplitude;
   a digital signal source configured to output at a signal level output a first binary signal having a useful signal frequency which has no more than 10% of the carrier frequency; and
   a first logic component configured to perform an AND operation of two input signals, the first logic component having a first logic input, a second logic input, and a first logic output configured to output a first logic output signal with respect to a first reference potential, wherein the first logic input is connected to the signal level output, and wherein the second logic input is connected to the carrier signal source output,
wherein the second sub-circuit includes:
   a signal input;
   a signal output; and
   a first resistor-capacitor (RC) element;
   wherein the signal input, the signal output, and the first RC element are connected in parallel to one another with respect to a second reference potential,
   wherein for a first galvanic isolation a first isolating capacitor is connected between the first logic output and the signal input, and
   wherein for a second galvanic isolation a second isolating capacitor is connected between the first reference potential and the second reference potential.
2. The transmitting device according to claim 1, wherein the first and second isolating capacitors each include a series circuit of a plurality of capacitors.
3. The transmitting device according to claim 1, wherein the signal input includes at least two Schottky diodes arranged in series with each other parallel to the first RC element, wherein the first isolating capacitor between the at least two Schottky diodes is connected to the signal input.
4. The transmitting device according to claim 1, wherein the carrier signal source includes an oscillator.
5. The transmitting device according to claim 1, wherein a Schmitt trigger is arranged between the first logic output and the first isolating capacitor.
6. The transmitting device according to claim 1, wherein a Schmitt trigger is arranged between the first RC element and the signal output.
7. The transmitting device according to claim 1, wherein the carrier signal frequency is not less than 1 MHz (megahertz), and wherein the useful signal frequency is not less than 10 kHz (kilohertz).
8. The transmitting device according to claim 1, further comprising:
a first complex programmable logic device (CPLD) or a microcontroller, wherein the carrier signal source and the first logic component are integrated into the CPLD or the microcontroller.
9. The transmitting device according to claim 8, wherein the signal output is connected to a bus.
10. The transmitting device according to claim 9, further comprising:
a reverse transmission path for transmitting a second digital signal from the second sub-circuit to the first sub-circuit, wherein the reverse transmission path includes a second logic component configured to perform an AND operation of two input signals, the second logic component having a third logic input, a fourth logic input, and a second logic output, wherein the third logic input is connected to the bus, wherein the fourth logic input is applied with a potential that is tapped between the first isolating capacitor and the first RC element, and wherein the second logic output is connected to a signal input of the first sub-circuit via a third isolating capacitor.
11. The transmitting device according to claim 10, further comprising:
a second CPLD or microcontroller, wherein the second logic component is integrated into the second CPLD or microcontroller.
12. The transmitting device according to claim 1, wherein the digital signal source comprises a microprocessor.

13. A field device of industrial process measurement technology, comprising:
a transmitting device, including:
a first sub-circuit; and
a second sub-circuit galvanically isolated from the first sub-circuit, the second sub-circuit configured to be supplied with power from the first sub-circuit and to communicate digitally with the first sub-circuit,
wherein the first sub-circuit includes:
a carrier signal source configured to output at a carrier signal source output a carrier signal having a constant carrier frequency and a constant amplitude;
a digital signal source configured to output at a signal level output a first binary signal having a useful signal frequency which has no more than 10% of the carrier frequency; and
a first logic component configured to perform an AND operation of two input signals, the first logic component having a first logic input, a second logic input, and a first logic output configured to output a first logic output signal with respect to a first reference potential, wherein the first logic input is connected to the signal level output, and wherein the second logic input is connected to the carrier signal source output,
wherein the second sub-circuit includes:
a signal input;
a signal output; and
a first resistor capacitor (RC) element,
wherein the signal input, the signal output, and the first RC element are connected in parallel to one another with respect to a second reference potential,
wherein for a first galvanic isolation a first isolating capacitor is connected between the first logic output and the signal input, and
wherein for a second galvanic isolation a second isolating capacitor is connected between the first reference potential and the second reference potential,
wherein the first sub-circuit further includes a main electronics unit of the field device,
wherein the second sub-circuit further includes a sensor electronics unit of the field device, and
wherein the sensor electronics unit comprises an inter-integrated circuit ($I^2C$) converter for converting a primary signal dependent on a measured value into a digital signal which is to be output to the first sub-circuit via an $I^2C$ bus and a reverse transmission path.

14. The field device according to claim 13, wherein the $I^2C$ converter includes a capacitive transducer.

* * * * *